United States Patent
An et al.

(10) Patent No.: US 11,289,308 B2
(45) Date of Patent: Mar. 29, 2022

(54) APPARATUS AND METHOD FOR PROCESSING SUBSTRATE AND METHOD OF MANUFACTURING SEMICONDUCTOR DEVICE USING THE METHOD

(71) Applicant: SAMSUNG ELECTRONICS CO., LTD., Suwon-si (KR)

(72) Inventors: Sangjin An, Suwon-si (KR); Minseop Park, Hwaseong-si (KR); Chanyeong Jeong, Suwon-si (KR); Sunggil Kang, Hwaseong-si (KR); Yeongkwang Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/860,745

(22) Filed: Apr. 28, 2020

(65) Prior Publication Data

US 2021/0098232 A1    Apr. 1, 2021

(30) Foreign Application Priority Data

Sep. 27, 2019 (KR) .................. 10-2019-0119823

(51) Int. Cl.
*H01J 37/32* (2006.01)
*H01L 21/67* (2006.01)
(Continued)

(52) U.S. Cl.
CPC .... *H01J 37/3244* (2013.01); *H01J 37/32082* (2013.01); *H01J 37/32495* (2013.01);
(Continued)

(58) Field of Classification Search
CPC ............ H01J 37/32082; H01J 37/3244; H01J 37/32715; H01J 37/32495;
(Continued)

(56) References Cited

U.S. PATENT DOCUMENTS 6,132,512 A * 10/2000 Horie ................ C23C 16/45565
                                                         118/715
6,333,272 B1 12/2001 McMillin et al.
(Continued)

FOREIGN PATENT DOCUMENTS

EP          1 177 112 B1    6/2011

*Primary Examiner* — Yuechuan Yu
(74) *Attorney, Agent, or Firm* — Sughrue Mion, PLLC

(57) ABSTRACT

A substrate processing apparatus includes a process chamber including a plasma generation region configured to receive at least one first process gas and have first radio-frequency (RF) power applied thereto, to generate plasma; a gas distribution region configured to supply the at least one first process gas to the plasma generation region; a gas mixing region configured to receive at least one second process gas and radicals generated in the plasma generation region to generate an etchant based on the radicals being mixed with the at least one second process gas; a pedestal on which a substrate is disposed; a processing region in which the pedestal is installed; and a shower head configured to supply the etchant from the gas mixing region to the processing region, the substrate disposed on the pedestal being processed by the etchant. The gas mixing region is separate from each of the plasma generation region and the processing region.

15 Claims, 16 Drawing Sheets

(51) Int. Cl.
*H01L 21/3065* (2006.01)
*H01L 21/683* (2006.01)

(52) U.S. Cl.
CPC .... *H01J 37/32715* (2013.01); *H01L 21/3065* (2013.01); *H01L 21/67069* (2013.01); *H01L 21/6833* (2013.01); *H01J 2237/334* (2013.01)

(58) Field of Classification Search
CPC ......... H01J 2237/334; H01L 21/67069; H01L 21/3065; H01L 21/6833
See application file for complete search history.

(56) References Cited

U.S. PATENT DOCUMENTS

| | | |
|---|---|---|
| 7,270,713 B2 | 9/2007 | Blonigan et al. |
| 7,285,228 B2 | 10/2007 | Laermer et al. |
| 7,932,181 B2 | 4/2011 | Singh et al. |
| 8,999,856 B2 | 4/2015 | Zhang et al. |
| 9,330,926 B2 | 5/2016 | Chebi et al. |
| 10,262,837 B2 | 4/2019 | Choi et al. |
| 2014/0283746 A1* | 9/2014 | Seo .................. H01J 37/32495 118/723 R |

* cited by examiner

C:E
50:50

APPARATUS AND METHOD FOR PROCESSING SUBSTRATE AND METHOD OF MANUFACTURING SEMICONDUCTOR DEVICE USING THE METHOD

CROSS-REFERENCE TO RELATED APPLICATION

This application claims priority to Korean Patent Application No. 10-2019-0119823, filed on Sep. 27, 2019, in the Korean Intellectual Property Office, the disclosure of which is incorporated by reference herein in its entirety.

BACKGROUND

The disclosure relates to an apparatus and method for processing a substrate, and more particularly, to an apparatus and method for processing a substrate using plasma.

In general, plasma is being widely used in processes of manufacturing semiconductor devices, plasma display panels (PDPs), liquid crystal displays (LCDs), and solar cells. Typical processes using plasma may include a dry etching process, a plasma-enhanced chemical vapor deposition (PECVD) process, a sputtering process, and an ashing process. Capacitively coupled plasma (CCP), inductively coupled plasma (ICP), a hybrid of CCP and ICP, helicon plasma, or microwave plasma may be used in plasma processes. A plasma process may be closely related to or affected by plasma parameters, for example, electron density, electron temperature, ion linear velocity, and ion energy. In particular, plasma density and plasma uniformity may greatly affect product reliability and throughput.

SUMMARY

Example embodiments provide an apparatus and method for processing a substrate, which may adjust types and characteristics of an etchant in a plasma process and thus, effectively process a substrate.

According to an aspect of an example embodiment, there is provided a substrate processing apparatus including: a process chamber including a plasma generation region configured to receive at least one first process gas and have first radio-frequency (RF) power applied thereto, to generate plasma; a gas distribution region configured to supply the at least one first process gas to the plasma generation region; a gas mixing region configured to receive at least one second process gas and radicals generated in the plasma generation region to generate an etchant based on the radicals being mixed with the at least one second process gas; a pedestal on which a substrate is disposed; a processing region in which the pedestal is installed; and a shower head configured to supply the etchant from the gas mixing region to the processing region, the substrate disposed on the pedestal being processed by the etchant, wherein the gas mixing region is arranged separately from each of the plasma generation region and the processing region.

According to an aspect of an example embodiment, there is provided a substrate processing apparatus including: a process chamber; a first gas supply unit configured to supply at least one first process gas to the process chamber; a second gas supply unit configured to supply at least one second process gas to the process chamber; and at least one radio-frequency (RF) source configured to apply RF power to the process chamber, wherein the process chamber includes: a plasma generation region in which plasma is generated, a gas mixing region in which the at least one second process gas is mixed with radicals generated in the plasma generation region to generate an etchant, a processing region in which a substrate is processed by the etchant, and a shower head configured to supply the etchant to the processing region, wherein the gas mixing region is arranged separately from each of the plasma generation region and the processing region.

According to an aspect of an example embodiment, there is provided a method of processing a substrate, the method including: supplying at least one first process gas into a plasma generation region of the process chamber; applying radio-frequency (RF) power to the plasma generation region to generate plasma in the plasma generation region; supplying radicals generated by the plasma and at least one second process gas to a gas mixing region of the process chamber to generate an etchant in the gas mixing region; and supplying the etchant generated in the gas mixing region through a shower head of the process chamber to a processing region of the process chamber to process the substrate in the processing region, wherein the gas mixing region is arranged separately from each of the plasma generation region and the processing region.

According to an aspect of an example embodiment, there is provided a method of manufacturing a semiconductor device, the method including: supplying at least one first process gas into a plasma generation region of a process chamber; applying radio-frequency (RF) power to the plasma generation region to generate plasma in the plasma generation region; supplying radicals generated by the plasma and at least one second process gas to a gas mixing region of the process chamber to generate an etchant in the gas mixing region; supplying the etchant generated in the gas mixing region to a processing region of the process chamber through a shower head of the process chamber to process a substrate in the processing region; and performing a subsequent semiconductor process on the substrate, wherein the gas mixing region is arranged separately from each of the plasma generation region and the processing region.

BRIEF DESCRIPTION OF THE DRAWINGS

The above and other aspect of example embodiments will be more clearly understood from the following detailed description taken in conjunction with the accompanying drawings, in which.

DETAILED DESCRIPTION

Figure 1:
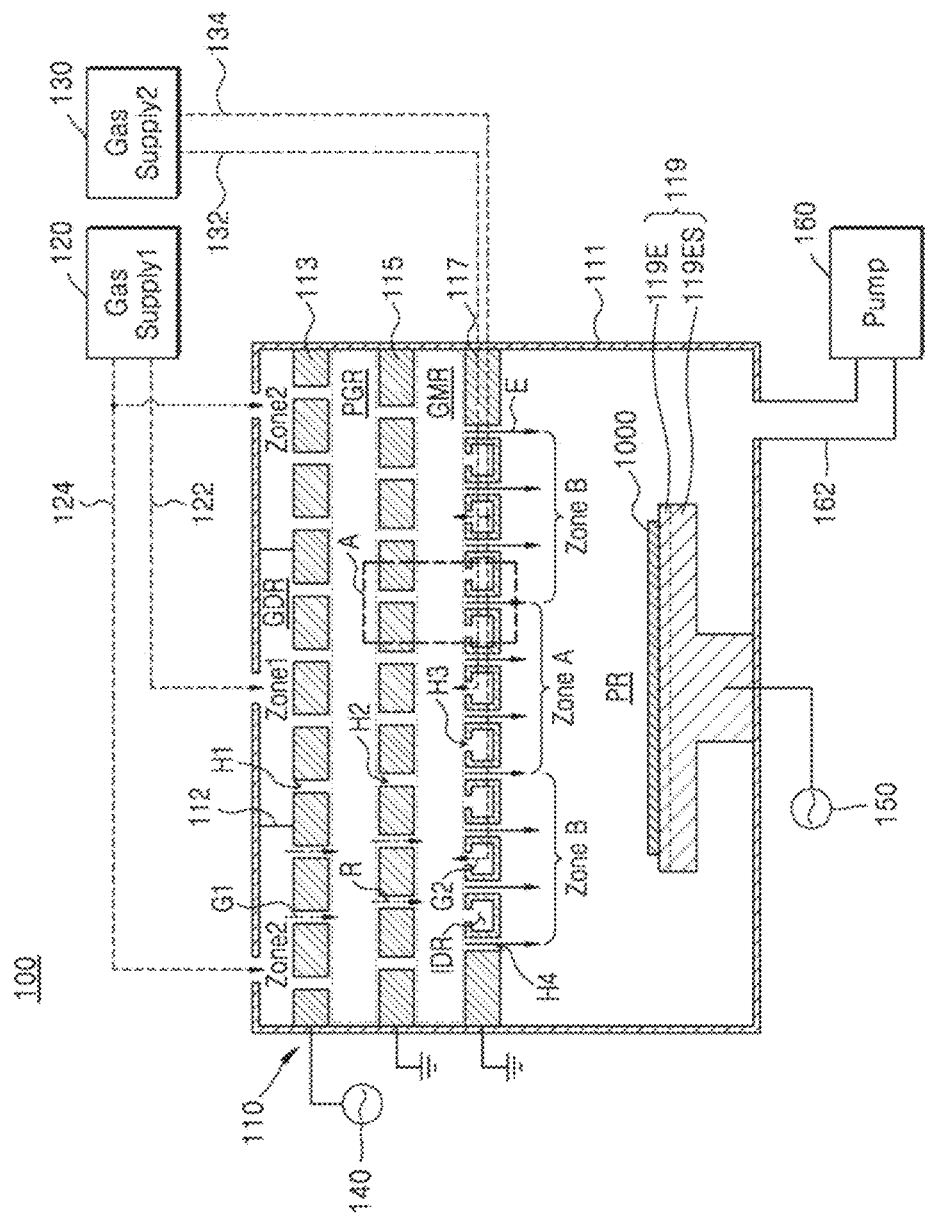
FIG. 1 is a schematic block diagram of a substrate processing apparatus according to an example embodiment.

Example embodiments will now be described more fully with reference to the accompanying drawings in which some embodiments are shown. The same reference numerals are used to denote the same elements throughout the drawings, and repeated descriptions thereof will be omitted.

Figure 2:
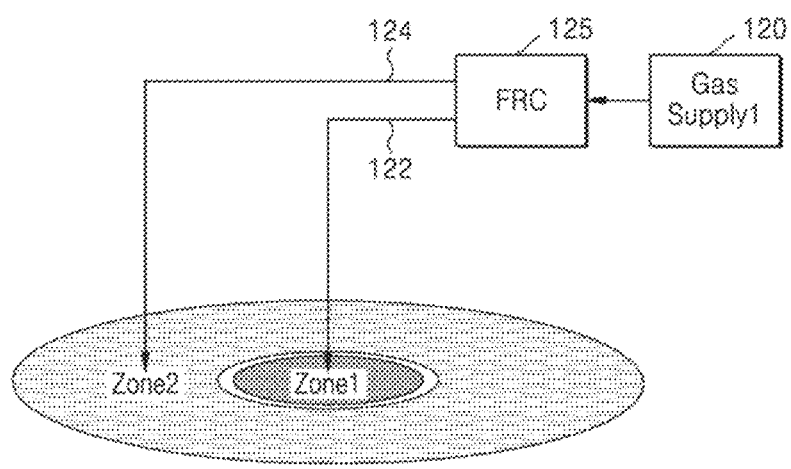
FIG. 2 is a conceptual plan view of a structure of a gas distribution region in the substrate processing apparatus of FIG. 1.
Figure 3:
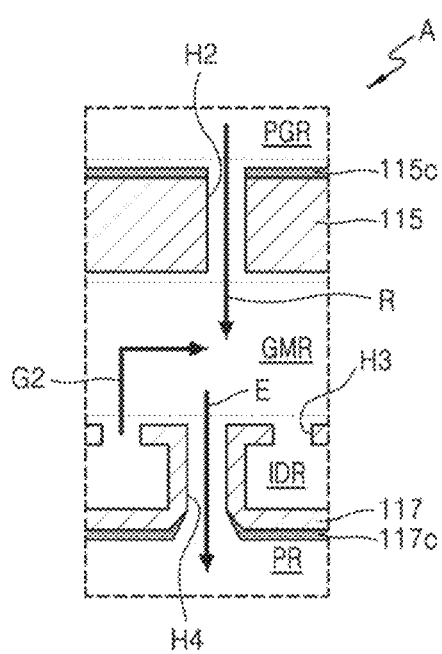
FIG. 3 is an enlarged cross-sectional view of a portion A in the substrate processing apparatus of FIG. 1.

FIG. 1 is a schematic block diagram of a substrate processing apparatus 100 according to an example embodiment. FIG. 2 is a conceptual plan view of a structure of a gas distribution region in the substrate processing apparatus 100 of FIG. 1. FIG. 3 is an enlarged cross-sectional view of a portion A in the substrate processing apparatus 100 of FIG. 1.

Referring to FIGS. 1, 2, and 3, the substrate processing apparatus 100 may include a process chamber 110, a first gas supply unit 120, a second gas supply unit 130, a first radio-frequency (RF) source 140, a second RF source 150, and a pump 160.

The process chamber 110 may be a chamber in which a substrate 1000 is processed using plasma. The process chamber 110 may be, for example, a chamber configured to perform processes such as a deposition process, an etching process, and a cleaning process, on the substrate 1000. The substrate processing apparatus 100 may be subdivided depending on a function of the process chamber 110. Specifically, the substrate processing apparatus 100 may be subdivided into a deposition apparatus, an etching apparatus, or a cleaning apparatus depending on the process (e.g., a deposition process, an etching process, or a cleaning process) performed in the process chamber 110. In some example embodiments, an etching process and a cleaning process may be performed together in the process chamber 110. Here, the substrate 1000, which is a target for a plasma process, may include a wafer or may include a wafer and at least one material film located on the wafer.

The process chamber 110 may include a body 111, an upper electrode plate 113, a ground plate 115, a shower head 117, and a pedestal 119. Also, an inner space of the process chamber 110 may be separated and distinguished into a gas distribution region GDR, a plasma generation region PGR, a gas mixing region GMR, and a processing region PR by the upper electrode plate 113, the ground plate 115, and the shower head 117.

More specifically, the body 111 may define the inner space of the process chamber 110, which is divided into a plurality of regions. The body 111 may hermetically seal the inner space of the process chamber 110 from the outside. An overall outer structure of the body 111 may have a cylindrical shape, an elliptical column shape, or a polygonal column shape. In other words, a horizontal cross-section of the body 111 may have a circular ring shape, an elliptical ring shape, or a polygonal ring shape. The body 111 may typically include a metal material and may be maintained in an electrical ground state to cut off electrical noise from the outside during a plasma process. A liner may be arranged inside the body 111. The liner may protect the body 111 and may cover metal structures protruding from the body 111 to prevent the occurrence of metal contamination due to arcing inside the process chamber 110. The liner may include a metal material (e.g., aluminum) or a ceramic material and be coated with a plasma-resistant material film near the plasma generation region PGR. Here, the plasma-resistant material film may be, for example, an yttrium oxide ($Y_2O_3$) film. However, the plasma-resistant material film is not limited to the $Y_2O_3$ film.

The gas distribution region GDR may be arranged over the upper electrode plate 113. That is, as shown in FIG. 1, the gas distribution region GDR may be defined by an upper portion of the body 111 and an upper surface of the upper electrode plate 113. As illustrated with dashed arrows, the gas distribution region GDR may receive at least one first process gas G1 from the first gas supply unit 120 and supply the at least one first process gas G1 to the plasma generation region PGR. Here, the at least one first process gas G1 may be a source gas for generating plasma in the plasma generation region PGR. For example, the first process gas G1 may be a fluorine (F)-containing gas (e.g., HF and $NF_3$), which is mainly used in an etching process or a cleaning process. However, the first process gas G1 is not limited to the fluorine-containing gas.

The gas distribution region GDR may be separated by a partition wall 112 into a first zone Zone 1 and a second zone Zone 2. When viewed from above, as shown in FIG. 2, Zone 1 and Zone 2 may be separated into concentric circular structures from each other. That is, Zone 1 may be a central portion corresponding to an inner concentric circle or disk, and Zone 2 may be an edge portion corresponding to an outer concentric circle or ring surrounding the disk of Zone 1.

The amount of the first process gas G1 supplied to Zone 1 may be different from the amount of the first process gas G1 supplied to Zone 2. For example, a density of the first process gas G1 may be higher in Zone 2 than in Zone 1. Conversely, the density of the first process gas G1 may be higher in Zone 1 than in Zone 2. Also, in some example embodiments, the density of the first process gas G1 in Zone 1 may be substantially the same as that in Zone 2. The first process gas G1 may be supplied to Zone 1 through a first supply conduit 122 and supplied to Zone 2 through a second supply conduit 124. In addition, as shown in FIG. 2, the amounts of the first process gas G1 supplied to Zone 1 and Zone 2 may be adjusted by a flow ratio controller (FRC) 125 installed at the first and second supply conduits 122 and 124.

In the substrate processing apparatus 100, although the gas distribution region GDR is separated into two zones, separated zones of the gas distribution region GDR are not limited to two zones. Also, separated structures of the gas distribution region GDR are not limited to the separated concentric circular structures shown in FIG. 2. For example, the gas distribution region GDR may be separated into at least three zones, and the separated zones may not have concentric circular structures.

The upper electrode plate 113 may be arranged at or near an uppermost portion of the inside of the body 111 of the process chamber 110 and have a circular, elliptical, or polygonal plate shape corresponding to a shape of the body 111. The upper electrode plate 113 may spatially separate the gas distribution region GDR from the plasma generation region PGR. The upper electrode plate 113 may include a plasma-resistant material. Also, the upper electrode plate 113 may include a metal material (e.g., aluminum) or a ceramic material and be coated with a plasma-resistant material film near the plasma generation region PGR. Here, the plasma-resistant material film may be, for example, an yttrium oxide ($Y_2O_3$) film. However, the plasma-resistant material film is not limited to the $Y_2O_3$ film.

A plurality of first fine holes H1 may be formed in the upper electrode plate 113. The first process gas G1 stored in the gas distribution region GDR may be supplied through the first fine holes H1 to the plasma generation region PGR. Assuming that the first fine holes H1 have the same size and are uniformly arranged in the upper electrode plate 113, the densities of the first process gas G1 supplied to different portions of the plasma generation region PGR, which correspond to Zone 1 and Zone 2 of the gas distribution region GDR, may vary according to the amounts of the first process gas G1 supplied to Zone 1 and Zone 2 of the gas distribution region GDR. However, in some example embodiments, the size of the first fine holes H1 or a density at which the first fine holes H1 are arranged may vary according to positions of the first fine holes H1 in the upper electrode plate 113. Further, the densities of the first process gas G1 supplied to the portions of the plasma generation region PGR, which correspond to Zone 1 and Zone 2 of the gas distribution region GDR, may still vary according to the amounts of the first process gas G1 supplied to Zone 1 and Zone 2 of the gas distribution region GDR. Accordingly, the densities of the first process gas G1 supplied to the different portions of the plasma generation region PGR, which correspond to Zone 1 and Zone 2 of the gas distribution region GDR, may be adjusted by adjusting the amounts of the first process gas G1 supplied to Zone 1 and Zone 2 of the gas distribution region GDR.

The first RF source 140 may be connected to the upper electrode plate 113. The first RF source 140 may generate RF power and apply the RF power through the upper electrode plate 113 to the plasma generation region PGR. The first RF source 140 may include at least two sources and generate and output RF power having various frequencies. For example, the first RF source 140 may include three sources. Specifically, from among the three sources, a first source may generate RF power with a first frequency ranging from several MHz to several tens of MHz, a second source may generate RF power with a second frequency ranging from several hundred kHz to several MHz, and a third source may generate RF power with a third frequency ranging from several tens of kHz to several hundred kHz. Also, each of the three sources of the first RF source 140 may generate power of several hundred to tens of thousands of watts (W) and apply the generated power to the plasma generation region PGR. However, frequencies and powers of RF power generated by the three sources are not limited to the above numeral values. Also, the number of sources of the first RF source 140 is not limited to three and may be greater than or fewer than three.

In a plasma process, the upper electrode plate 113 may function as an upper electrode, and the ground plate 115 arranged under the plasma generation region PGR on an opposite side of the PGR from the upper electrode plate 113 may function as a ground. In the plasma process, the first process gas G1 may be supplied to the plasma generation region PGR, RF power may be applied by the first RF source 140 to the upper electrode plate 113, and the ground plate 115 may be maintained in an electrical ground state, and thus, plasma may be generated in the plasma generation region PGR.

The density of plasma generated at a corresponding position may vary according to the amount of the first process gas G1 supplied to each position of the plasma generation region PGR. For example, a large amount of plasma may be generated at a position to which a large amount of first process gas G1 is supplied, and thus, the density of plasma may be increased. In contrast, a small amount of plasma may be generated at a position to which a small amount of first process gas G1 is supplied, and thus, the density of plasma may be reduced.

The ground plate 115 may be arranged between the upper electrode plate 113 and the shower head 117 in the body 111 of the process chamber 110 and may define the plasma generation region PGR together with the upper electrode plate 113. That is, the ground plate 115 may define a lower boundary of the plasma generation region PGR and the upper electrode plate 113 may define an upper boundary of the plasma generation region PGR. As described above, the ground plate 115 may be maintained in an electrical ground state in a plasma process. A structure and material of the ground plate 115 may be the same as those of the upper electrode plate 113, which are described above. For example, the ground plate 115 may have a circular, elliptical, or polygonal plate shape. Also, the ground plate 115 may include a plasma-resistant material. Alternatively, the ground plate 115 may include a metal or ceramic and an outer surface of the ground plate 115 may be coated with a plasma-resistant material film.

A plurality of second fine holes H2 may be formed in the ground plate 115. Radical R generated by the plasma generation region PGR may be supplied through the second fine holes H2 to the gas mixing region GMR. The second fine holes H2 may have the same size and be uniformly arranged in the ground plate 115. However, in some example embodiments, the size of the second fine holes H2 or a density at which the second fine holes H2 are arranged may vary according to positions of the second fine holes H2 in the ground plate 115.

For reference, when plasma is generated, components including radicals R, ions, electrons, and ultraviolet (UV) rays may be generated. At least one of the components, such as the radicals R, the ions, the electrons, and the UV rays, may be used in an etching process, a deposition process, and a cleaning process. Basically, the radicals R may be electrically neutral, and the ions may have an electrical polarity. Thus, the radicals R may be used in a cleaning process or an etching process for isotropically etching an etching target. In addition, the radicals R may be used to prevent or inhibit the deposition of a specific component in a deposition process. The ions may be used to anisotropically etch an etching target in an etching process.

In addition, in a plasma process using radicals R, for example, a cleaning process or an isotropic etching process, only the radicals R may be provided to the gas mixing region GMR, while components, such as ions, electrons, and UV rays, may not be provided to the gas mixing region GMR but may instead be removed. In other words, the components, such as ions, electrons, and UV rays, may be blocked without passing through the ground plate 115, while only the radicals R may be supplied to the gas mixing region GMR through the second fine holes H2 of the ground plate 115.

The amount of the radicals R generated from plasma may be proportional to a plasma density. Thus, the amount of the radicals R may differ according to different positions of the plasma generation region PGR. Also, the amount of the radicals R supplied through the ground plate 115 may also differ according to position, based on a difference in the amount of the radicals R according to the position of the plasma generation region PGR. In a specific example, when the density of the first process gas G1 is higher in Zone 1 than in Zone 2, a central portion of the plasma generation region PGR corresponding to Zone 1 may have a higher plasma density and therefore a larger amount of radicals R than an edge portion of the plasma generation region PGR corresponding to Zone 2. Accordingly, the amount of the radicals R supplied through a central portion of the ground plate 115 may be larger than the amount of the radicals R supplied through an edge portion of the ground plate 115. As a result, by adjusting the supplied amount of the first process gas G1 according to a zone of the gas distribution region GDR, the amount of the radicals R supplied to the gas mixing region GMR through the ground plate 115 may be adjusted to vary by position in the gas mixing region GMR.

The shower head 117 may be arranged located under the ground plate 115 inside the body 111 and may define the gas mixing region GMR together with the ground plate 115. That is, the ground plate 115 may define an upper boundary of the gas mixing region GMR and the shower head 117 may define a lower boundary of the gas mixing region GMR. The shower head 117 may have a circular, elliptical, or polygonal plate shape and may include a plasma-resistant material. Alternatively, the shower head 117 may include a metal or ceramic and an outer surface of the shower head 117 may be coated with a plasma-resistant material film.

In the substrate processing apparatus 100, the shower head 117 may include an internal distribution region (IDR). As illustrated with dashed arrows, the internal distribution region IDR may receive at least one second process gas G2 from the second gas supply unit 130 and supply the at least one second process gas G2 to the gas mixing region GMR. Here, the second process gas G2 may be a source gas that reacts with the radicals R in the gas mixing region GMR to generate an etchant E.

A function and structure of the internal distribution region IDR may be similar to the function and structure of the gas distribution region GDR. In other words, similar to the gas distribution region GDR, the internal distribution region IDR may be separated into a first internal zone Zone A and a second internal zone Zone B by a partition wall. In FIG. 1, each of Zone A and Zone B is subdivided into and illustrated as a plurality of square boxes because the shower head 117 is illustrated with a cross-section. Zone A and Zone B may actually have structures similar to those of Zone 1 and Zone 2 shown in FIG. 2. In other words, Zone A may have a structure that is integrally connected in the form of an inner concentric circle or disk, and a plurality of fourth fine holes H4 may be arranged to pass through Zone A from the gas mixing region GMR to a processing region PR described below. Similarly, Zone B may have a structure that is integrally connected in the form of an outer concentric circle, and a plurality of fine holes H4 may be arranged to pass through Zone B from the gas mixing region GMR to the processing region PR. Accordingly, although FIG. 1 illustrates an example in which spaces between the fourth fine holes H4 are separated in the form of square boxes from each other, the spaces in square boxes may be actually connected to each other in each of Zone A and Zone B.

The amount of the second process gas G2 supplied to Zone A may be different from the amount of the second process gas G2 supplied to Zone B. For example, a density of the second process gas G2 may be higher in Zone B than in Zone A. Conversely, the density of the second process gas G2 may be higher in Zone A than in Zone B. Also, the density of the second process gas G2 in Zone A may be the same as that in Zone B. The second process gas G2 may be supplied to Zone A through a third supply conduit 132 and supplied to Zone B through a fourth supply conduit 134. In addition, similar to the structure shown in FIG. 2, the amounts of the second process gas G2 supplied to Zone A and Zone B may be adjusted by an FRC installed at the third and fourth supply conduits 132 and 134.

A plurality of third fine holes H3 may be formed in an upper layer of the shower head 117. As shown in FIG. 1, the third fine holes H3 may be formed on a side of the shower head 117 facing the gas mixing region GMR. The second process gas G2 may be supplied from the internal distribution region IDR through the third fine holes H3 to the gas mixing region GMR. The third fine holes H3 may have the same size and be uniformly arranged in the shower head 117. However, in some example embodiments, the size of the third fine holes H3 or a density at which the third fine holes H3 are arranged may vary according to positions of the third fine holes H3 in the shower head 117.

The density or amount of the etchant E generated may vary according to the amount of the second process gas G2 and/or the radicals R supplied to each position of the gas mixing region GMR. For example, a large amount of etchant E may be generated at a position of the gas mixing region GMR, to which a large amount of second process gas G2 and/or radicals R is supplied, and thus, the density of the etchant E may be increased. In contrast, a small amount of etchant E may be generated at a position of the gas mixing region GMR, to which a small amount of second process gas G2 and/or radicals R is supplied, and thus, the density of the etchant E may be reduced. Accordingly, by adjusting the supplied amount of the first process gas G1 according to a zone of the gas distribution region GDR and by adjusting the supplied amount of the second process gas G2 according to an internal zone of the internal distribution region IDR, the density or amount of the etchant E may be adjusted according to a position of the gas mixing region GMR. In other words, the density or amount of etchant E may be adjusted by causing different amounts of the first process gas G1 to be supplied to different zones of the gas distribution region GDR, or by causing different amounts of the second process gas G2 to be supplied to different internal zones of the internal distribution region IDR.

A plurality of fourth fine holes H4 may be formed in the shower head 117. As shown in FIG. 1, the fourth fine holes H4 may be formed to pass through the shower head 117 from an upper side facing the gas mixing region GMR to a lower side facing the processing region PR. The etchant E generated by the gas mixing region GMR may be supplied through the fourth fine holes H4 to the processing region PR. The fourth fine holes H4 may have the same size and be uniformly arranged in the shower head 117. However, in some example embodiments, the size of the fourth fine holes H4 or a density at which the fourth fine holes H4 are arranged may vary according to positions of the fourth fine holes H4 in the shower head 117.

As described above, the density or amount of the etchant E generated in the gas mixing region GMR may vary according to the amounts of the second process gas G2 and/or the radicals R, which are supplied according to a corresponding position. For example, when the second process gas G2 and/or the radicals R are supplied in smaller amounts to a central portion of the gas mixing region GMR corresponding to Zone A than to an edge portion of the gas mixing region GMR corresponding to Zone B, the density or amount of the etchant E generated in the central portion of the gas mixing region GMR may be lower or smaller than the density or amount of the etchant E generated in the edge portion of the gas mixing region GMR. Accordingly, the amount of the etchant E supplied to the processing region PR through the fourth fine holes H4 of Zone A may be smaller than the amount of the etchant E supplied to the processing region PR through the fourth fine holes H4 of Zone B. As a result, the etchant E may be supplied in a larger amount to the edge portion of the processing region PR than to the central portion of the processing region PR. In FIG. 1, the amount of the etchant E may be indicated by a length of an arrow. That is, a short arrow illustrated in the fourth fine hole H4 of Zone A indicates that a small amount of etchant E is supplied, while a long arrow illustrated in the fourth fine hole H4 of Zone B indicates that a large amount of etchant E is supplied.

In conclusion, by adjusting the supplied amount of the first process gas G1 according to a zone of the gas distribution region GDR and by adjusting the supplied amount of the second process gas G2 according to an internal zone of the internal distribution region IDR, the density or amount of the etchant E may be adjusted according to a position of the gas mixing region GMR. Accordingly, the density or amount of the etchant E supplied to the processing region PR through the shower head 117 may be adjusted according to a position of the processing region PR.

FIG. 3 is an enlarged view of portion A of FIG. 1. Referring to FIG. 3, the plasma generation region PGR may be located over the ground plate 115, and a first coating film 115c may be formed on an upper surface of the ground plate 115. The first coating film 115c may include a plasma-resistant material. Also, the processing region PR may be located under the shower head 117, and a second coating film 117c may be formed on a lower surface of the shower head 117. The second coating film 117c may also include a plasma-resistant material. The first coating film 115c and the second coating film 117c may include, for example, $Y_2O_3$. However, materials of the first coating film 115c and the second coating film 117c are not limited to $Y_2O_3$.

Plasma may also be generated in the processing region PR. Accordingly, the second coating film 117c may be formed to protect the shower head 117 from plasma of the processing region PR. As shown in FIG. 1, when the shower head 117 functions as a ground and the pedestal 119 functions as a lower electrode, plasma may be generated in the processing region PR. Thus, in addition to the ground plate 115, the shower head 117 may also be put into an electrical ground state, and the second RF source 150 may be connected to the pedestal 119 and apply RF power to the pedestal 119. The second RF source 150 may be the same as the first RF source 140 described above. However, a frequency and power of RF power of the second RF source 150 may be different from the frequency and power of RF power of the first RF source 140. Also, an additional process gas may be supplied to the processing region PR.

The internal distribution region IDR may be formed inside the shower head 117. The internal distribution region IDR may be surrounded by an upper layer and a lower layer of the shower head 117 and sidewalls of the fourth fine holes H4. The third fine holes H3 may be formed to pass through the upper layer of the shower head 117 to the gas mixing region GMR. Thus, the second process gas G2 may be supplied upward from the internal distribution region IDR to the gas mixing region GMR through the third fine hole H3. In contrast, the radicals R may be supplied downward from the plasma generation region PGR to the gas mixing region GMR through the second fine holes H2 of the ground plate 115. As described above, the second process gas G2 and the radicals R may be supplied in opposite directions and mixed and reacted with each other, thereby improving generation efficiency of the etchant E. The generated etchant E may be supplied to the processing region PR located at a lower side of the shower head 117 through the fourth fine holes H4 configured to pass through the entire shower head 117.

As shown in FIG. 1, the pedestal 119 may be arranged in a lower portion of the processing region PR of the process chamber 110. The substrate 1000, which is a target for a plasma process, may be arranged on the pedestal 119 and supported by the pedestal 119. The pedestal 119 may include an electrostatic chuck (ESC) 119E and an ESC support 119ES. The ESC 119E may include an electrode configured to chuck and dechuck a substrate. As described above, the ESC 119E may be connected to the second RF source 150 and function as a lower electrode during a plasma process.

The ESC support 119ES may support the ESC 119E arranged thereon and include a metal (e.g., aluminum) or a ceramic insulator (e.g., alumina). A heating element (e.g., a heater) may be arranged inside the ESC support 119ES, and heat may be transmitted from the heater to the ESC 119E or the substrate 1000. A power application interconnection may be arranged under the center of the ESC support 119ES and connected to an electrode of the ESC 119E. However, the pedestal 119 is not limited to the electrostatic chuck ESC 119E and the ESC support 119ES.

The pump 160 may be connected to the process chamber 110 through an exhaust conduit 162. By-products generated during and after the plasma process may be exhausted through the exhaust conduit 162 by using the pump 160. Also, the pump 160 may adjust an inner pressure of the process chamber 110.

The etchant E may be generated due to the gas mixing region GMR arranged separately from the plasma generation region PGR and/or the processing region PR, thereby increasing the efficiency of mixing the second process gas G2 with the radicals R. Accordingly, the generation efficiency of the etchant E may be greatly improved. Furthermore, the supplied amounts of the first process gas G1 and the second process gas G2 may be adjusted according to a zone by using the gas distribution region GDR and the internal distribution region IDR, and thus, the density or amount of the etchant E may be adjusted according to a position of the processing region PR. Accordingly, the plasma process may be effectively performed on the substrate 1000.

For reference, a gas mixing region may not be additionally present in a substrate processing apparatus of the related art. Thus, a second process gas may be supplied to a plasma generation region and reacted with radicals in the plasma generation region to generate an etchant. Alternatively, the second process gas and the radicals may be supplied to a processing region and reacted with each other in the processing region to generate an etchant. In the above-described substrate processing apparatus of the related art, the second process gas may be dissociated or radicalized and have changed properties. Thus, the efficiency of mixing of the second process gas with the radicals may be reduced, and the generation efficiency and performance of an etchant may also be reduced. Furthermore, in the substrate processing apparatus of the related art, it may be difficult to adjust the density or amount of the etchant according to a position of the processing region.

In contrast, in the substrate processing apparatus 100 according to an example embodiment, the gas mixing region GMR may be formed separately from the plasma generation region PGR and/or the processing region PR, and the second process gas G2 may be supplied to the gas mixing region GMR. Thus, the second process gas G2 may be neither dissociated nor radicalized but mixed with the radicals R in the gas mixing region GMR while maintaining intrinsic characteristics thereof. Accordingly, the efficiency of mixing the second process gas G2 with the radicals R may be increased, and the generation efficiency and performance of the etchant E may be improved.

In addition, in the substrate processing apparatus 100 according to an example embodiment, the supplied amount of the first process gas G1 may be adjusted according to a zone by using the gas distribution region GDR, and thus, the density of plasma and the amount of the radicals R relative to the density of the plasma may be adjusted according to a position. Also, the supplied amount of the second process gas G2 may be adjusted according to an internal zone by using the internal distribution region IDR, and thus, the density or amount of the etchant E in the gas mixing region GMR and thus in the processing region PR may be adjusted according to a position. Accordingly, the plasma process may be effectively performed on the substrate 1000.

Furthermore, in the substrate processing apparatus 100, by varying a type of the first process gas G1 supplied to the gas distribution region GDR and a type of the second process gas G2 supplied to the internal distribution region IDR of the shower head 117, characteristics of a finally generated etchant E may be adjusted. As a result, the substrate processing apparatus 100 may generate various types of etchants E having various characteristics. Since a film that may be etched depends on a type of the etchant E, various films including metals and non-metals may be selectively etched by changing the type of the etchant E. Accordingly, the substrate processing apparatus 100 is not limited to a specific process but may apply a plasma process to various processes.

For reference, in the substrate processing apparatus of the related art, which was devoid of the gas mixing region, the second process gas was supplied to the plasma generation region and reacted with radicals therein to generate an etchant. By comparison, in the substrate processing apparatus 100 according to an example embodiment, an etchant was generated in the gas mixing region GMR instead of in the plasma generation region. Results of comparison of etched amounts of wafers obtained in both the cases are as follows.

First, the substrate processing apparatus of the related art exhibited a maximum etched amount of about 46.8 Å, a minimum etched amount of about 30.2 Å, an average etch rate of about 38.6 Å, a range (i.e., the maximum etched amount-the minimum etched amount) of about 16.6 Å, and a uniformity (i.e., (range/2)/average etch rate*100) of about 21.5%. In contrast, the substrate processing apparatus 100 according to an example embodiment exhibited a maximum etched amount of about 74.9 Å, a minimum etched amount of about 66.6 Å, an average etch rate of about 70.7 Å, a range of about 8.3 Å, and a uniformity of about 5.9%. Accordingly, it can be confirmed that the substrate processing apparatus 100 according to an example embodiment may have much higher etching efficiency and much higher uniformity than the substrate processing apparatus of the related art.

As described above, the substrate processing apparatus of the related art may be configured such that the second process gas is supplied to the plasma generation region in which plasma is formed or supplied to the processing region. In this case, problems may occur due to the presence of a fine hole configured to supply the second process gas. Specifically, in general, a special treatment process (e.g., a coating process) may be performed on the plasma generation region or the processing region to prevent etching or corrosion due to plasma. However, when the fine hole is formed in a portion to be coated, it may be difficult to perform the special treatment process (e.g., the coating process). Alternatively, the fine hole may be blocked due to the coating process, and thus, the supplying of the second process gas may be partially or completely precluded to degrade process performance. Furthermore, coating residue may penetrate into a structure comprising the fine holes through the fine hole during the coating process and act as contaminants.

In contrast, in the substrate processing apparatus 100 according to an example embodiment, the gas mixing region GMR may be formed separately from the plasma generation region PGR and/or the processing region PR, and the third fine holes H3 that are configured to supply the second process gas G2 may be formed in the shower head 117 in the direction of the gas mixing region GMR. Accordingly, a special treatment process (e.g., a coating process) may be easily performed on a structure (e.g., the upper electrode plate 113, the ground plate 115, and the shower head 117) that surrounds the plasma generation region PGR and/or the processing region PR such that the special treatment process is not performed on the surface that includes the third fine holes H3. Thus, problems, such as the clogging of the third fine holes H3 or the penetration of contaminants, may be resolved.

Figure 4:
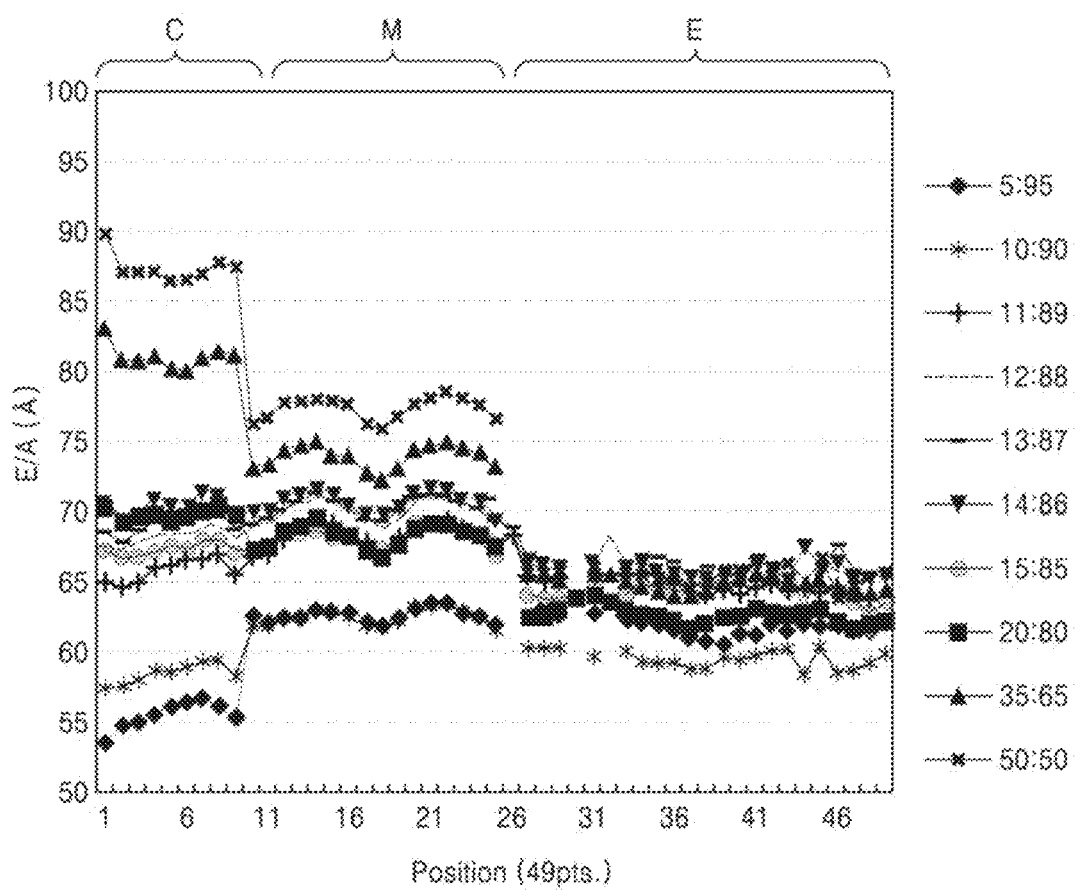
FIG. 4 is a graph showing etched amounts measured at a plurality of points of a wafer relative to a ratio of amounts of a gas supplied to a central portion and an edge portion of a gas mixing region.
Figure 5A:
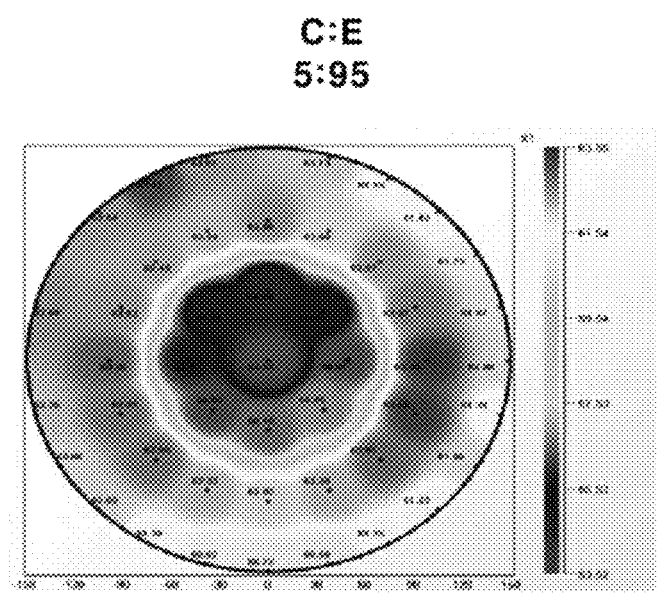
FIGS. 5A to 5F are images each showing etched amounts measured at a plurality of points of a wafer relative to a ratio of amounts of a gas supplied to a central portion and an edge portion of a gas mixing region.
Figure 5B:
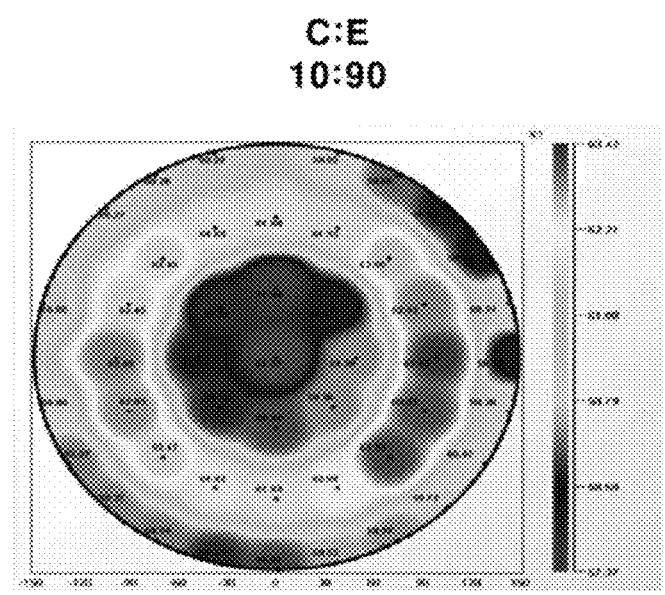
Figure 5C:
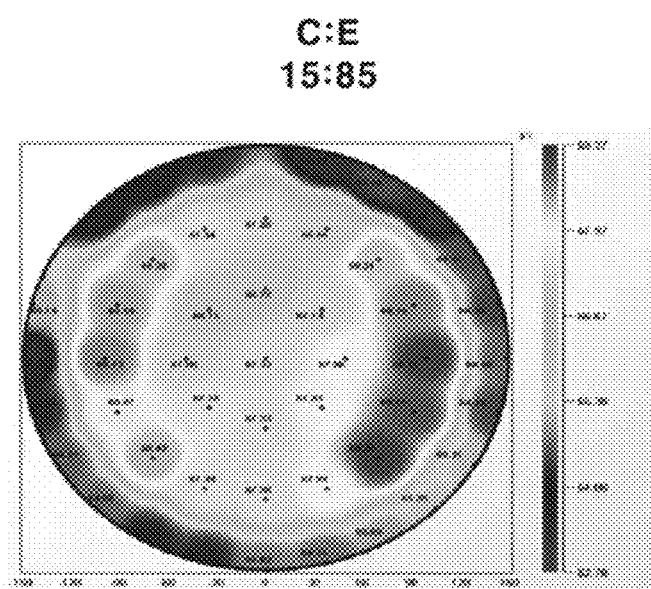
Figure 5D:
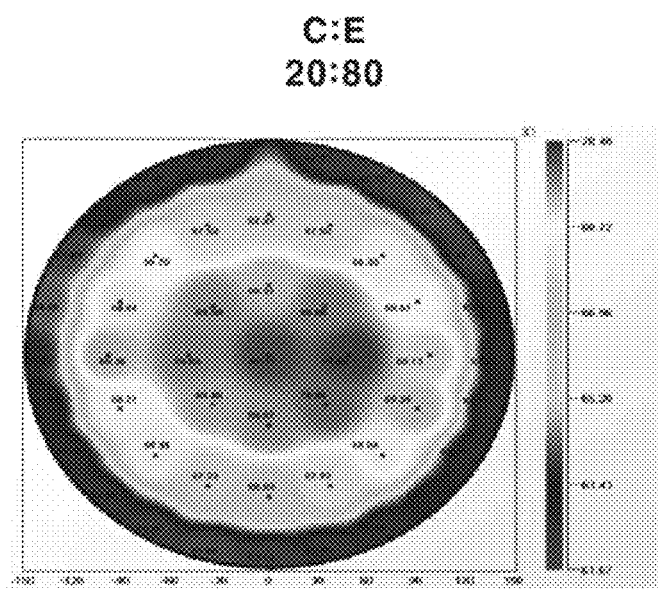
Figure 5E:
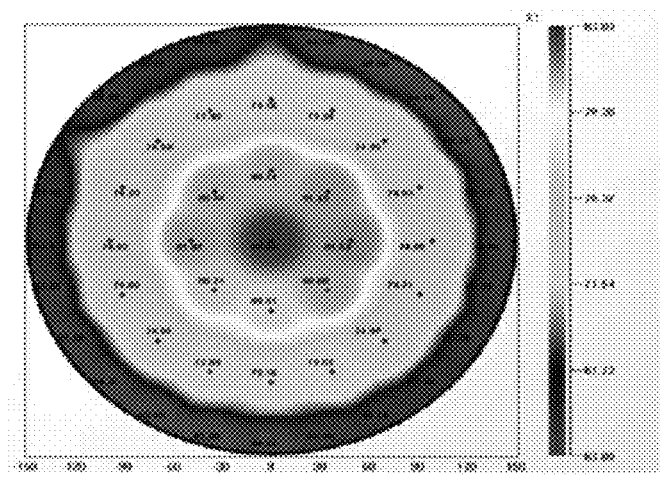
Figure 5F:
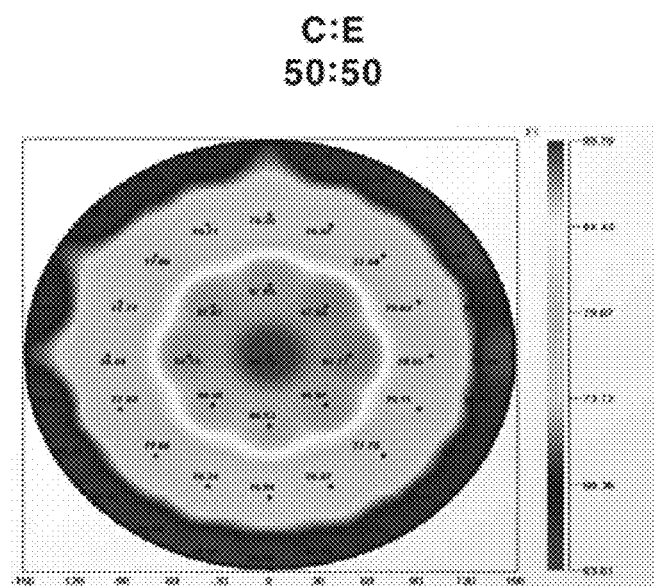

FIG. 4 is a graph showing etched amounts measured at a plurality of points of a wafer relative to a ratio of amounts of a gas supplied to a central portion and an edge portion of a gas mixing region GMR. In FIG. 4, the abscissa denotes the points of the wafer (i.e., a distance away from a center of the wafer), and the ordinate denotes etched amounts E/A, which are expressed in units of A. The graph of FIG. 4 will be described with reference to FIGS. 1 to 3.

Referring to FIG. 4, points corresponding to positions on the wafer may be sequentially selected from a center of the wafer to an outer portion thereof in a spiral. Thus, points corresponding to positions 1 to 10 described on the abscissa may be located in a central portion C of the wafer, points corresponding to positions 11 to 25 may be located in a middle portion M of the wafer, and points corresponding to positions 26 to 49 may be located in an edge portion E of the wafer.

A gas mixing ratio of the gas mixing region GMR may be, for example, a ratio of an amount of a second process gas G2 supplied to the central portion C of the gas mixing region GMR to an amount of the second process gas G2 supplied to the edge portion E of the gas mixing region GMR. Here, the central portion C and the edge portion E may respectively correspond to Zone A and Zone B in FIG. 1. As shown on a right side of the graph of FIG. 4, the gas mixing ratio of the second process gas G2 is divided into 10 values from 5:95 to 50:50, but the gas mixing ratio of the second process gas G2 is not limited thereto.

As can be seen from the graph of FIG. 4, an etch rate may be adjusted at each position of the wafer by adjusting the gas mixing ratio. For example, it can be seen that when the same amount of the second process gas G2 is supplied to the central portion C as to the edge portion E, that is, when the gas mixing ratio of the second process gas G2 is controlled to be 50:50, the etched amount of the edge portion E of the wafer is much smaller than the etched amount of the central portion C thereof. Also, it can be seen that when the amount of the second process gas G2 supplied to the edge portion of the gas mixing region GMR is controlled to be very large, that is, when the gas mixing ratio is controlled to be 5:95, the etched amount of the central portion C of the wafer is smaller than the etched amount of the edge portion E thereof.

As a result, the etching process may be uniformly performed throughout the wafer by appropriately adjusting the gas mixing ratio of the second process gas G2. In some example embodiments, the central portion C or the edge portion E of the wafer may be non-uniformly etched. Although only the gas mixing ratio of the second process gas G2 has been described as an example, the etching of the wafer may be more precisely adjusted by adjusting a gas mixing ratio of the first process gas G1 together with adjustment of the gas mixing ration of the second process gas G2.

FIGS. 5A to 5F are images each showing etched amounts measured at a plurality of points of a wafer relative to a ratio of amounts of a gas supplied to a central portion and an edge portion of a gas mixing region GMR. A ratio C:E and numbers described in an upper portion of each of the images of FIGS. 5A to 5F may each refer to a gas mixing ratio of the gas mixing region GMR, namely, a ratio of an amount of a second process gas G2 supplied to a central portion C of the gas mixing region GMR to an amount of the second process gas G2 supplied to an edge portion E of the gas mixing region GMR. For example, in FIG. 5A, the gas mixing ratio is shown as 5:95, while in FIG. 5F, the gas mixing ration is shown as 50:50.

Referring to FIGS. 5A to 5F, results similar to those of the graph of FIG. 4 may be confirmed. For example, it can be seen that when the amount of the second process gas G2 supplied to the edge portion of the gas mixing region GMR is controlled to be very high, that is, when a gas mixing ratio is controlled to be 5:95 (see FIG. 5A), the etched amount of the central portion C of the wafer is smaller than the etched amount of the edge portion E thereof. Also, it can be seen that when the same amount of the second process gas G2 is supplied to the central portion C and the edge portion E, that is, when the gas mixing ratio is controlled to be 50:50 (see FIG. 5F), the etched amount of the edge portion E of the wafer is smaller than the etched amount of the central portion C thereof.

Figure 6A:
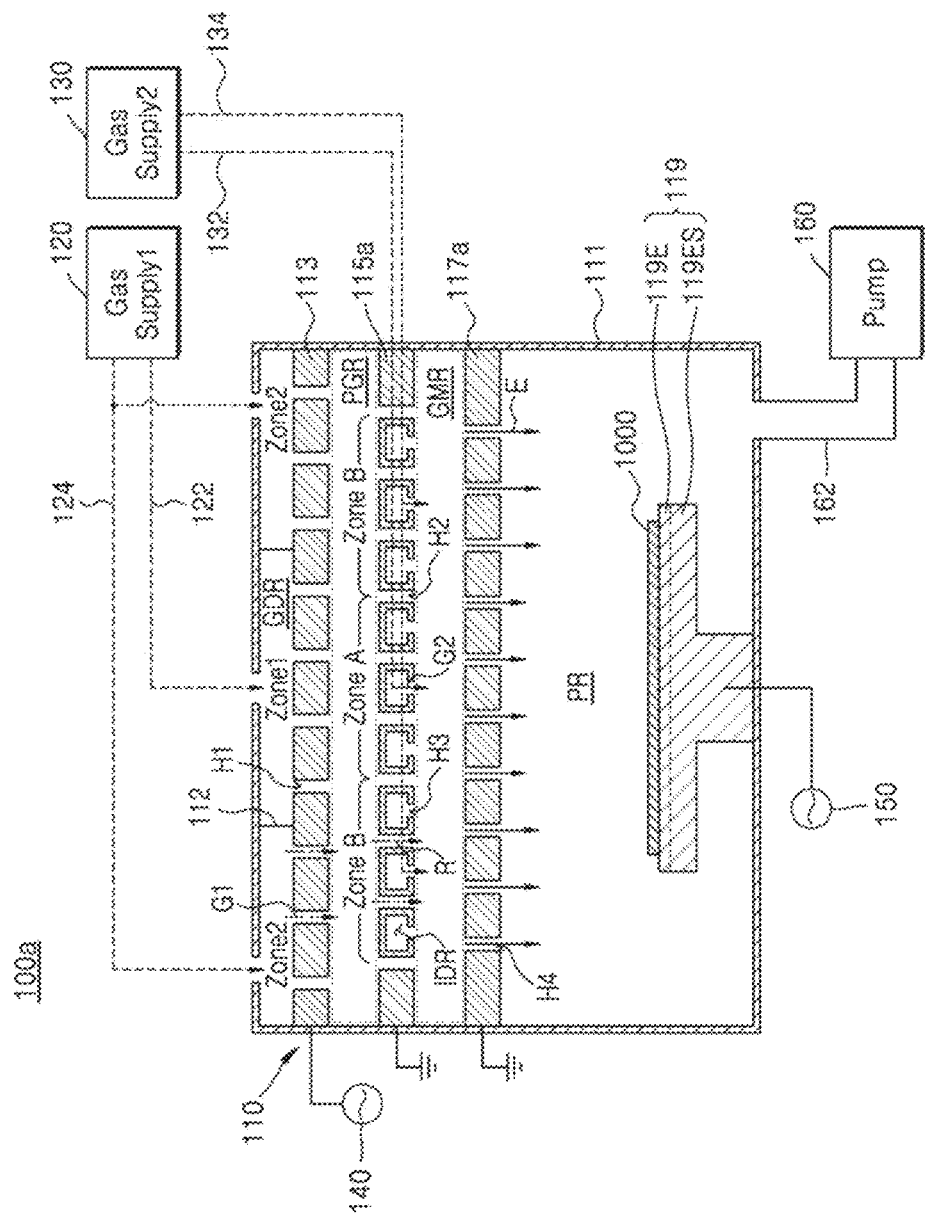
FIGS. 6A, 6B, and 6C are schematic block diagrams of substrate processing apparatuses according to example embodiments.
Figure 6B:
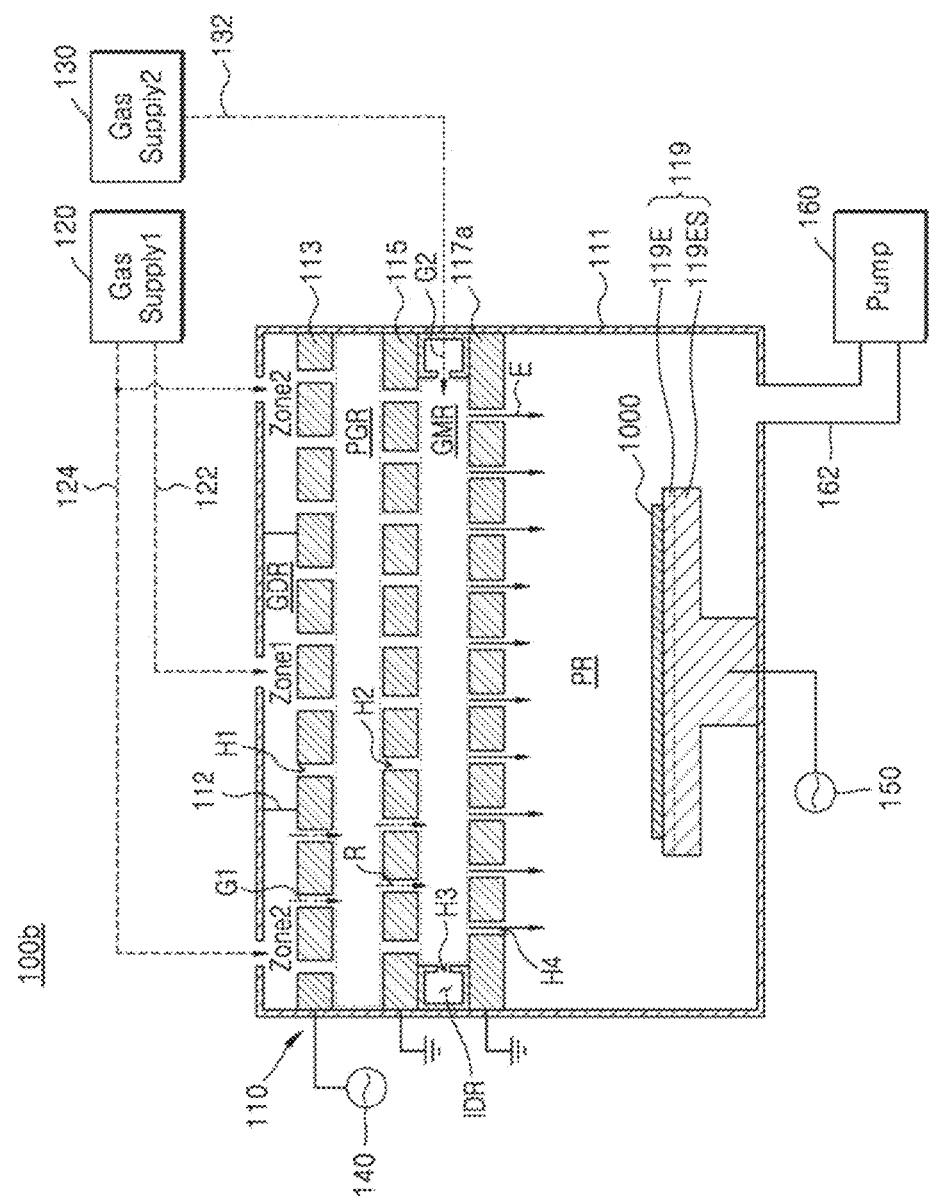
Figure 6C:
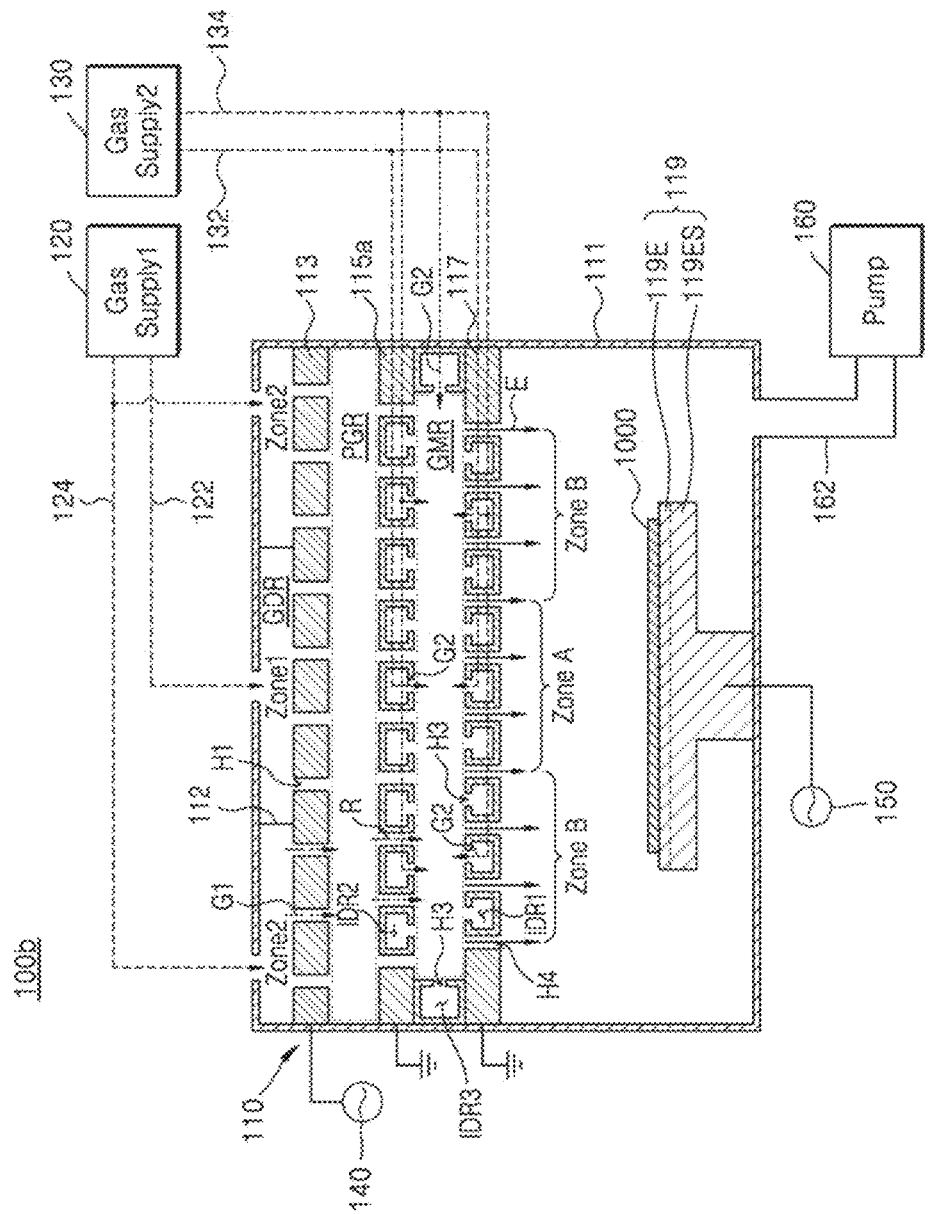

FIGS. 6A to 6C are schematic block diagrams of substrate processing apparatuses 100a to 100c according to example embodiments. The same description as in FIGS. 1 to 5 will be omitted or briefly described.

Referring to FIG. 6A, the substrate processing apparatus 100a according to an example embodiment may be similar to the substrate processing apparatus 100 of FIG. 1 in that a gas mixing region GMR is arranged in a process chamber 110 separately from a plasma generation region PGR and a processing region PR. However, the substrate processing apparatus 100a of the present example embodiment may be different from the substrate processing apparatus 100 of FIG. 1 in terms of a position of an internal distribution region IDR configured to adjust a second process gas G2 and supply the second process gas G2 to the gas mixing region GMR.

Specifically, in the substrate processing apparatus 100a, the internal distribution region IDR may be formed in a ground plate 115a instead of in a shower head 117a. Also, a third fine hole H3 may be formed in a lower layer of the ground plate 115a, and the second process gas G2 may be supplied downward from the internal distribution region IDR toward the gas mixing region GMR. Accordingly, in the substrate processing apparatus 100a, both the radicals R supplied from the plasma generation region PGR and the second process gas G2 supplied from the internal distribution region IDR may be supplied downward to the gas mixing region GMR in the same direction.

In the substrate processing apparatus 100a, a supplied amount of a first process gas G1 may be adjusted by a gas distribution region GDR, and a supplied amount of the second process gas G2 may be adjusted by the internal distribution region IDR. Accordingly, the radicals R and the second process gas G2 may be adjusted and supplied according to a position of the gas mixing region GMR, and thus, the etchant E may be generated at a different density or in a different amount according to the position of the gas mixing region GMR. As a result, the etchant E may be supplied through a fourth fine hole H4 of a shower head 117a and the density or amount of the etchant E may be adjusted according to a position of the processing region PR.

Referring to FIG. 6B, the substrate processing apparatus 100b according to an example embodiment may be similar to the substrate processing apparatus 100 of FIG. 1 in that a gas mixing region GMR is arranged in a process chamber 110 separately from a plasma generation region PGR and a processing region PR. However, the substrate processing apparatus 100b of the present example embodiment may be different from the substrate processing apparatus 100 of FIG. 1 in terms of a position of an internal distribution region IDR.

Specifically, in the substrate processing apparatus 100b, the internal distribution region IDR may be formed in an inner portion of a body 111. Also, a third fine hole H3 may be formed in an inner sidewall of the body 111, and a second process gas G2 may be supplied sideward from the internal distribution region IDR toward the gas mixing region GMR. Thus, in the substrate processing apparatus 100b, the radicals R from the plasma generation region PGR and the second process gas from the internal distribution region IDR may be supplied to the gas mixing region GMR in directions perpendicular to each other.

In the substrate processing apparatus 100b, since the second process gas G2 is supplied to the gas mixing region GMR through the internal distribution region IDR formed in the body 111, the internal distribution region IDR may not be separated into respective internal zones by partition walls. In other words, since the substrate processing apparatus 100b is not configured such that the second process gas G2 is directly supplied to a central portion of the gas mixing region GMR, the internal distribution region IDR may not need to be separated into zones for separately supplying the second process gas G2 to the central portion and an edge portion of the gas mixing region GMR.

The substrate processing apparatus 100b may be advantageous in a plasma process where a high density of the second process gas G2 is required at the edge portion of the gas mixing region GMR. Furthermore, in the substrate processing apparatus 100b, a structure of the process chamber 110 may be simplified, and the process chamber 110 may be easily connected to a second gas supply unit 130.

Referring to FIG. 6C, the substrate processing apparatus 100c according to an example embodiment may be similar to the substrate processing apparatus 100 of FIG. 1 in that a gas mixing region GMR is arranged in a process chamber 110 separately from a plasma generation region PGR and a processing region PR. However, the substrate processing apparatus 100c may be different from the substrate processing apparatus 100 of FIG. 1 in terms of positions and the number of internal distribution regions IDR.

Specifically, in the substrate processing apparatus 100c, the internal distribution region IDR may have a mixed structure of the internal distribution regions IDR of the substrate processing apparatus 100 of FIG. 1, the substrate processing apparatus 100a of FIG. 6A, and the substrate processing apparatus 100b of FIG. 6B. That is, the substrate processing apparatus 100c may include a first internal distribution region IDR1 formed in a shower head 117, a second internal distribution region IDR2 formed in a ground plate 115a, and a third internal distribution region IDR3 formed in a body 111. As shown in FIG. 6C, the second process gas G2 may be supplied to the gas mixing region GMR upward from the first internal distribution region IDR1, downward from the second internal distribution region IDR2, and sideward from the third internal distribution region IDR3. The first internal distribution region IDR1 and the second internal distribution region IDR2 may be separated into internal zones by partition walls. Thus, the second process gas G2 may be supplied by adjusting an amount of the second process gas G2 according to a position of the gas mixing region GMR.

Although the substrate processing apparatus 100c includes three internal distribution regions, a substrate processing apparatus may include only two internal distribution regions selected out of the first internal distribution region IDR1, the second internal distribution region IDR2, and the third internal distribution region IDR3. Also, to efficiently adjust the second process gas G2 according to a position of the gas mixing region GMR and supply the second process gas G2, the internal distribution region IDR may include various other combinations of the first internal distribution region IDR1, the second internal distribution region IDR2, and the third internal distribution region IDR3. For example, the internal distribution region IDR may be configured such that the second process gas G2 is supplied only to Zone B using the first internal distribution region IDR1 and supplied only to Zone A using the second internal distribution region IDR2.

Figure 7:
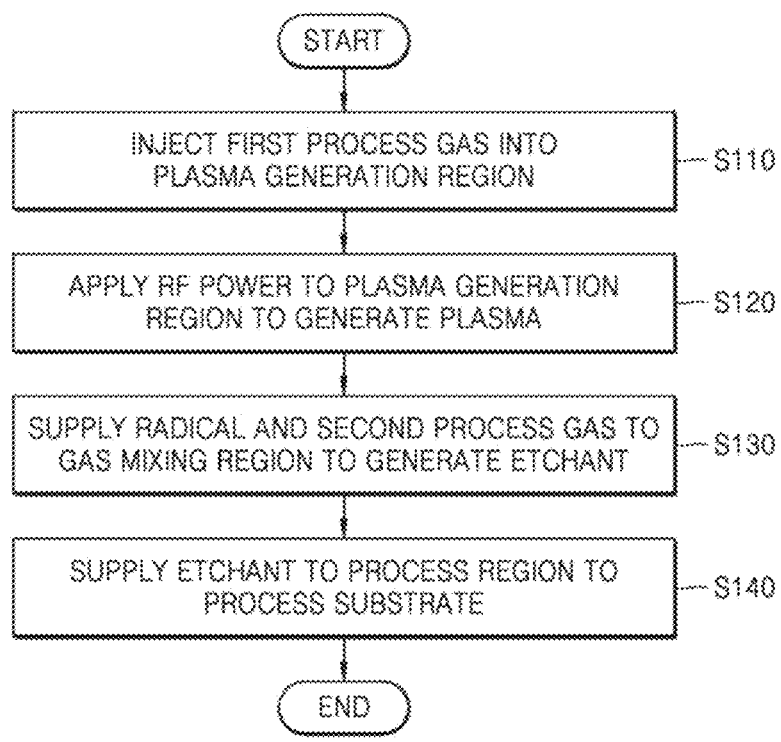
FIG. 7 is a flowchart illustrating a method of processing a substrate according to an example embodiment.

FIG. 7 is a flowchart illustrating a method of processing a substrate according to an example embodiment. The flowchart of FIG. 7 will be described with reference to FIG. 1, and the same description as in the substrate processing apparatus 100 shown in FIG. 1 will be omitted or briefly described.

Referring to FIG. 7, the method of processing the substrate according to may initially include supplying a first process gas G1 to a plasma generation region PGR of a process chamber 110 (S110). The first process gas G1 may be supplied from a first gas supply unit 120 through first and second supply conduits 122 and 124 and a gas distribution region GDR to the plasma generation region PGR. Also, a supplied amount of the first process gas G1 in the gas distribution region GDR may be adjusted by an FRC 125 according to a zone. Accordingly, the amount of the first supply gas G1 supplied to the plasma generation region PGR may be adjusted according to a position.

After the first process gas G1 is supplied, RF power may be applied to the plasma generation region PGR to generate plasma (S120). The RF power may be applied by a first RF source 140 through an upper electrode plate 113 to the plasma generation region PGR. A ground plate 115 may be put into an electrical ground state. Due to the generation of plasma, not only radicals R but also various components, such as electrons, ions, and UV rays, may be generated. The amount of the first process gas G1 may be adjusted and supplied according to a position of the plasma generation region PGR, and thus, the densities and amounts of plasma and radicals R may be adjusted according to the position of the plasma generation region PGR. In other words, different densities and/or amounts of plasma and radicals R may be generated at different positions in the plasma generation region PGR.

The radicals R and a second process gas G2 may be supplied to a gas mixing region GMR and mixed and reacted with each other to generate an etchant E (S130). The radicals R may be supplied from the plasma generation region PGR to the gas mixing region GMR, and the second process gas G2 may be supplied from an internal distribution region IDR provided inside the process chamber 110 to the gas mixing region GMR. For example, as in the substrate processing apparatus 100 of FIG. 1, the second process gas G2 may be supplied to the gas mixing region GMR in an opposite direction to a direction in which the radicals R are supplied by supplying the second process gas G2 through the internal distribution region IDR formed in a shower head 117. Also, as in the substrate processing apparatuses 100a to 100c of FIG. 6A to 6C, the second process gas G2 may be supplied to the gas mixing region GMR in various directions through internal distribution regions IDR formed at various positions inside the process chamber 110.

The second process gas G2 may be supplied to the gas mixing region GMR by adjusting an amount of the second process gas G2 according to an internal zone of the internal distribution region IDR. Thus, the density or amount of the generated etchant E may be adjusted according to a position of the gas mixing region GMR. In other words, different densities and/or amounts of the etchant E may be generated at different positions in the gas mixing region GMR.

The etchant E may be supplied to a processing region PR and process a substrate 1000 (S140). The etchant E may be supplied to the processing region PR through fourth fine holes H4 of the shower head 117. Also, by adjusting the density and amount of the etchant E according to a position of the gas mixing region GMR, the density and amount of the etchant E may be adjusted and supplied according to a position of the processing region PR. The substrate 1000 may be processed by supplying the etchant E to the processing region PR. Here, the processing of the substrate 1000 may be any one of a deposition process, an etching process, and a cleaning process on the substrate 1000.

In the method of processing the substrate, the density or amount of the etchant E may be adjusted according to the position of the processing region PR by using, for example, the substrate processing apparatus 100 of FIG. 1, in which the process chamber 110 includes the gas distribution region GDR, the internal distribution region IDR, and the gas mixing region GMR. Thus, a plasma process may be effectively performed on the substrate 1000.

Figure 8:
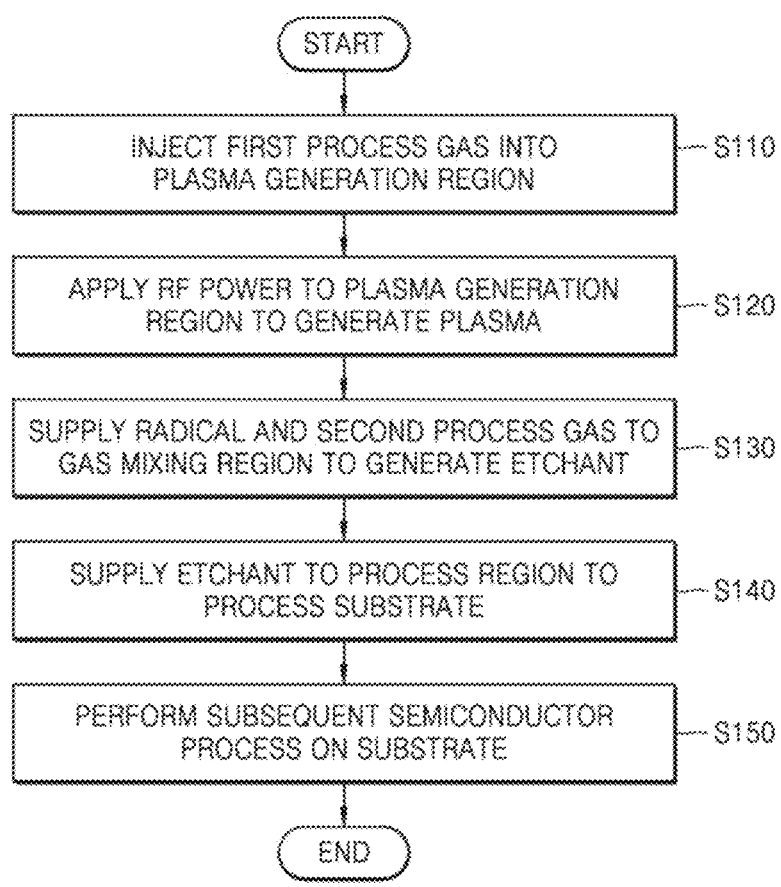
FIG. 8 is a flowchart illustrating a method of manufacturing a semiconductor device using a method of processing a substrate according to an example embodiment.

FIG. 8 is a flowchart illustrating a method of manufacturing a semiconductor device using a method of processing a substrate according to an example embodiment. The flowchart of FIG. 8 will be described with reference to FIG. 1, and the same description as in FIGS. 1 and 7 will be omitted or briefly described.

Referring to FIG. 8, in the method of manufacturing the semiconductor device, operation S110 of injecting a first process gas into a plasma generation region to operation S140 of processing a substrate by injecting an etchant into a processing region may be performed. The operation S110 of injecting the first process gas into the plasma generation region to the operation S140 of processing the substrate by injecting the etchant into the processing region are the same as those described with reference to FIG. 7.

Thereafter, a subsequent semiconductor process may be performed on a substrate 1000 (S150). The subsequent semiconductor process may include various processes. For example, the subsequent semiconductor process may include a deposition process, an etching process, an ion process, and a cleaning process. Here, the deposition process may include processes of forming various material layers, such as a chemical vapor deposition (CVD) process, a sputtering process, and a spin coating process. The etching process and the cleaning process may be processes using plasma or plasma-free processes. The ion process may include an ion implantation process, a diffusion process, and an annealing process. Integrated circuits (ICs) and interconnections may be formed on the substrate 1000 by performing the subsequent semiconductor process, and thus, a required semiconductor device may be manufactured.

The subsequent semiconductor process may include a process of individualizing a wafer corresponding to the substrate 1000 into respective semiconductor chips and a packaging process of mounting the semiconductor chips on a printed circuit board (PCB) and encapsulating the resultant structure with an encapsulant. Also, the subsequent semiconductor process may include a test process of testing the semiconductor device or a semiconductor package. The subsequent semiconductor processes may be performed to complete the semiconductor device or the semiconductor package. The operation S150 of performing the subsequent semiconductor process on the substrate 1000 will be described in detail below with reference to FIG. 9.

Figure 9:
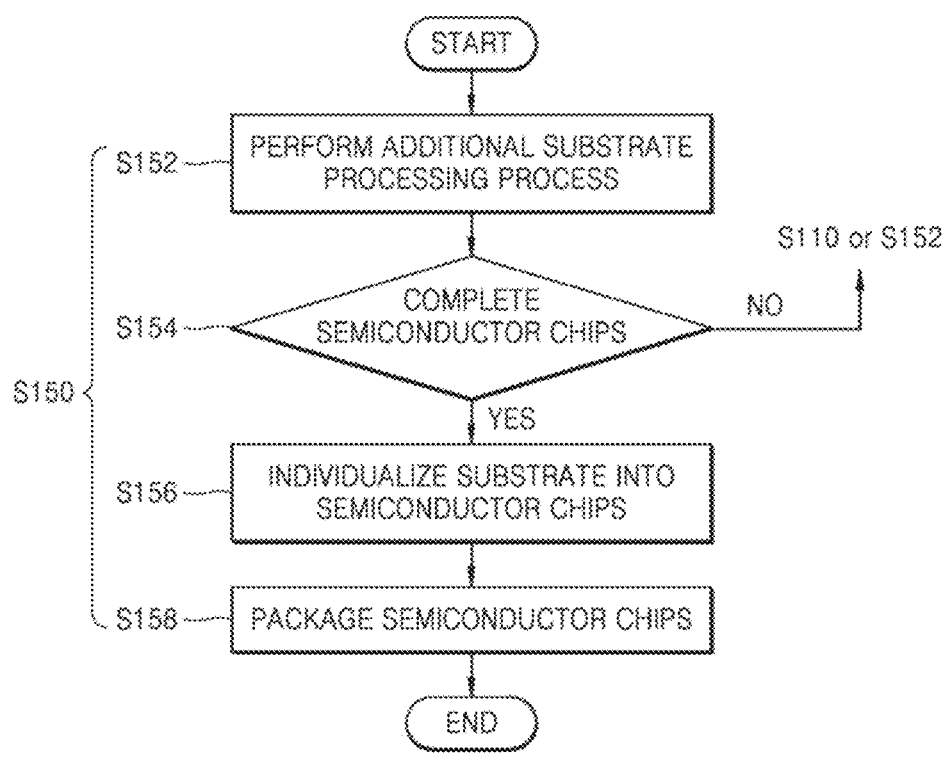
FIG. 9 is a detailed flowchart of an operation of performing a subsequent semiconductor process in the method of manufacturing the semiconductor device, which is shown in FIG. 8.

FIG. 9 is a detailed flowchart of an operation of performing a subsequent semiconductor process in the method of manufacturing the semiconductor device, which is shown as operation S150 in FIG. 8.

Referring to FIG. 9, to begin with, an additional substrate processing process may be performed (S152). Here, the additional substrate processing process may include a deposition process, an etching process, an ion process, and a cleaning process, which are performed on a substrate 1000. Also, the additional substrate processing process may or may not include a plasma process. However, plasma processes using the substrate processing apparatuses 100 and 100*a* to 100*c* of the example embodiments may or may not be included in the additional substrate processing process.

Thereafter, it may be determined whether semiconductor chips included in the substrate 1000 are completed (S154). When the semiconductor chips are completed (Yes), the substrate 1000 may be individualized into the respective semiconductor chips (S156). The individualization of the substrate 1000 into the respective semiconductor chips may be performed by a sawing process using a blade or laser. When the semiconductor chips are not completed (No), the process may proceed to operation S110 of injecting the first process gas into the plasma generation region of FIG. 8 or proceed to operation of S152 of performing the additional substrate processing process.

After the semiconductor chips are individualized, a packaging process may be performed on the semiconductor chips (S158). The packaging process may refer to a process of mounting the semiconductor chips on a PCB and encapsulating the resultant structure with an encapsulant. The packaging process may include forming a stack package by stacking a plurality of semiconductor chips in a multi-layered manner on the PCB or forming a package-on-package (POP) structure by stacking a stack package on a stack package. A semiconductor device or a semiconductor package may be completed by performing the packaging process on the semiconductor chips.

In the method of manufacturing the semiconductor device according to the present example embodiment, the plasma process may be effectively performed on the substrate by using any of the substrate processing apparatuses 100 and 100*a* to 100*c* shown in FIGS. 1 and 6A to 6C. Accordingly, the method of manufacturing the semiconductor device may manufacture excellent semiconductor devices having high reliability.

While example embodiments have been particularly shown and described, it will be understood that various changes in form and details may be made therein without departing from the spirit and scope of the following claims.

What is claimed is:

1. A substrate processing apparatus comprising:
 a process chamber comprising:
  a plasma generation region configured to receive at least one first process gas and have first radio-frequency (RF) power applied thereto, to generate plasma;
  a gas distribution region configured to supply the at least one first process gas to the plasma generation region;
  a gas mixing region configured to receive at least one second process gas and radicals generated in the plasma generation region to generate an etchant based on the radicals being mixed with the at least one second process gas;
  a pedestal on which a substrate is disposed;
  a processing region in which the pedestal is installed; and
  a shower head configured to supply the etchant from the gas mixing region to the processing region, the substrate disposed on the pedestal being processed by the etchant,
 wherein the gas mixing region is separate from each of the plasma generation region and the processing region,
 wherein the shower head comprises an internal distribution region configured to supply the at least one second process gas to the gas mixing region, and
 wherein the internal distribution region comprises at least two zones separated from each other to correspond to different planar positions of the gas mixing region such that the at least one second process gas does not flow between the at least two zones.

2. The substrate processing apparatus of claim 1, wherein the plasma generation region, the gas mixing region, and the processing region are separated from each other and sequentially arranged in a vertical direction,
 wherein the radicals are supplied downward from the plasma generation region to the gas mixing region,
 wherein the at least one second process gas is supplied from the internal distribution region to the gas mixing region, and
 wherein the etchant is supplied downward from the gas mixing region to the processing region.

3. The substrate processing apparatus of claim 1, wherein the gas distribution region is provided above the plasma generation region and comprises at least two zones separated from each other to correspond to different planar positions of the plasma generation region, and
 wherein the gas distribution region is configured to supply a first amount of the at least one first process gas to a first position of the plasma generation region and supply a second amount of the at least one first process gas to a second position of the plasma generation region, the first position and the second position corresponding to different zones of the at least two zones of the gas distribution region.

4. The substrate processing apparatus of claim 1, wherein the shower head is provided between the gas mixing region and the processing region,
 and
 wherein the internal distribution region is configured to supply a first amount of the at least one second process gas to a first position of the gas mixing region and supply a second amount of the at least one second process gas to a second position of the gas mixing region, the first position and the second position corresponding to different zones of the at least two zones.

5. The substrate processing apparatus of claim 1, further comprising a structure from among:
   a first structure configured to supply the at least one second process gas upward from below to the gas mixing region,
   a second structure configured to supply the at least one second process gas downward from above to the gas mixing region,
   a third structure configured to supply the at least one second process gas sideward to the gas mixing region, and
   a fourth structure in which at least two of the first to third structures are combined.

6. The substrate processing apparatus of claim 1, wherein the shower head is provided between the gas mixing region and the processing region,
   and
   wherein a first fine hole and a second fine hole are formed in the shower head, the first fine hole comprising a first path through which the at least one second process gas is supplied from the internal distribution region to the gas mixing region, and the second fine hole comprising a second path through which the etchant is supplied from the gas mixing region to the processing region.

7. The substrate processing apparatus of claim 1, wherein a ground plate is provided between the plasma generation region and the gas mixing region, and
   wherein the ground plate and the shower head are in an electrical ground state.

8. The substrate processing apparatus of claim 7, wherein a first RF power is applied to an upper electrode plate provided between the plasma generation region and the gas distribution region, and
   wherein a second RF power is applied to the pedestal.

9. The substrate processing apparatus of claim 7, wherein plasma is generated in the processing region, and
   wherein plasma-blocking coating films are formed on a surface of the ground plate facing the plasma generation region and a surface of the shower head facing the processing region.

10. A substrate processing apparatus comprising:
    a process chamber;
    a first gas supply unit configured to supply at least one first process gas to the process chamber;
    a second gas supply unit configured to supply at least one second process gas to the process chamber; and
    at least one radio-frequency (RF) source configured to apply RF power to the process chamber,
    wherein the process chamber comprises:
      a plasma generation region in which plasma is generated,
      a gas mixing region in which the at least one second process gas is mixed with radicals generated in the plasma generation region to generate an etchant,
      a processing region in which a substrate is processed by the etchant, and
      a shower head configured to supply the etchant to the processing region,
    wherein the gas mixing region is separate from each of the plasma generation region and the processing region,
    wherein the shower head comprises an internal distribution region configured to supply the at least one second process gas to the gas mixing region, and
    wherein the internal distribution region comprises at least two zones separated from each other to correspond to different planar positions of the gas mixing region such that the at least one second process gas does not flow between the at least two zones.

11. The substrate processing apparatus of claim 10, wherein the process chamber further comprises a gas distribution region configured receive the at least one first process gas from the first gas supply unit and supply the at least one first process gas to the plasma generation region, and
    wherein the RF power is applied to the plasma generation region.

12. The substrate processing apparatus of claim 10, wherein the internal distribution region is configured to supply a first amount of the at least one second process gas to a first position of the gas mixing region and supply a second amount of the at least one second process gas to a second position of the gas mixing region, and
    wherein a first fine hole and a second fine hole are formed in the shower head, the first fine hole providing a first path through which the at least one second process gas is supplied from the internal distribution region to the gas mixing region, and the second fine hole providing a second path through which the etchant is supplied from the gas mixing region to the processing region.

13. The substrate processing apparatus of claim 10, wherein the plasma generation region, the gas mixing region, and the processing region are separated from each other and sequentially arranged in a vertical direction,
    wherein the radicals are supplied downward from the plasma generation region to the gas mixing region, and
    wherein the second gas supply unit comprises a structure from among:
      a first structure configured to supply the at least one second process gas upward to the gas mixing region through the shower head,
      a second structure configured to supply the at least one second process gas downward to the gas mixing region through a ground plate configured to separate the plasma generation region from the gas mixing region,
      a third structure configured to supply the at least one second process gas sideward to the gas mixing region, and
      a fourth structure in which at least two of the first to third structures are combined.

14. The substrate processing apparatus of claim 10, wherein the process chamber further comprises:
    a ground plate provided under the plasma generation region and being in an electrical ground state, the ground plate being configured to separate the gas mixing region from the plasma generation region; and
    an upper electrode plate provided above the plasma generation region and to which first RF power is applied, the upper electrode plate comprising a fine hole configured to supply the at least one first process gas.

15. The substrate processing apparatus of claim 14, wherein the process chamber further comprises a pedestal provided in the processing region, the pedestal comprising an electrostatic chuck,
    wherein the shower head is electrically grounded and second RF power is applied to the pedestal to generate plasma in the processing region, and wherein plasma-blocking coating films are formed on an upper surface of the ground plate and a lower surface of the shower head.

* * * * *